(12) United States Patent
Park et al.

(10) Patent No.: US 9,196,601 B2
(45) Date of Patent: Nov. 24, 2015

(54) SEMICONDUCTOR DEVICE

(71) Applicant: Amkor Technology, Inc., Chandler, AZ (US)

(72) Inventors: Doo Hyun Park, Gyeonggi-do (KR); Seong Min Seo, Seoul (KR); Seok Woo Yun, Seoul (KR); Ji Hun Lee, Seoul (KR); Seo Yeon Ahn, Chungcheongbuk-do (KR); Young Rae Kim, Seoul (KR); Jong Sik Paek, Gyeonggi-do (KR)

(73) Assignee: AMKOR TECHNOLOGY, INC.

( * ) Notice: Subject to any disclaimer, the term of this patent is extended or adjusted under 35 U.S.C. 154(b) by 0 days.

(21) Appl. No.: 14/087,147

(22) Filed: Nov. 22, 2013

(65) Prior Publication Data

US 2015/0021791 A1    Jan. 22, 2015

(30) Foreign Application Priority Data

Jul. 16, 2013    (KR) .................. 10-2013-0083818

(51) Int. Cl.
*H01L 23/48* (2006.01)
*H01L 23/00* (2006.01)
*H01L 23/31* (2006.01)
*H01L 25/065* (2006.01)

(52) U.S. Cl.
CPC ............ *H01L 24/82* (2013.01); *H01L 23/3185* (2013.01); *H01L 23/481* (2013.01); *H01L 24/24* (2013.01); *H01L 25/0657* (2013.01); *H01L 24/92* (2013.01); *H01L 2224/24226* (2013.01); *H01L 2224/73267* (2013.01); *H01L 2224/82051* (2013.01); *H01L 2224/82101* (2013.01); *H01L 2224/82106* (2013.01); *H01L 2224/92244* (2013.01); *H01L 2924/15183* (2013.01)

(58) Field of Classification Search
CPC ................... H01L 24/24–24/25; H01L 24/12; H01L 24/82; H01L 25/544; H01L 25/0652; H01L 25/0657
See application file for complete search history.

(56) References Cited

U.S. PATENT DOCUMENTS

| | | | | |
|---|---|---|---|---|
| 2006/0258044 A1* | 11/2006 | Meyer et al. | .................. | 438/106 |
| 2008/0290492 A1* | 11/2008 | Chung et al. | .................. | 257/686 |
| 2011/0068427 A1* | 3/2011 | Paek et al. | .................... | 257/433 |
| 2011/0084382 A1* | 4/2011 | Chen et al. | .................... | 257/737 |
| 2011/0233782 A1* | 9/2011 | Chang et al. | .................. | 257/753 |
| 2012/0326307 A1* | 12/2012 | Jeong et al. | .................. | 257/738 |

\* cited by examiner

*Primary Examiner* — Ahmed Sefer

(74) *Attorney, Agent, or Firm* — McAndrews, Held & Malloy, Ltd.

(57) ABSTRACT

Various aspects of the present disclosure provide a semiconductor device and a method for manufacturing thereof, which can facilitate stacking of semiconductor die while saving manufacturing cost. In an example embodiment, the semiconductor device may comprise a first semiconductor die, a second semiconductor die bonded to a top surface of the first semiconductor die, and a redistribution layer electrically connecting the first semiconductor die to the second semiconductor die, wherein the redistribution layer is formed to extend along surrounding side portions of the second semiconductor die.

20 Claims, 11 Drawing Sheets

SEMICONDUCTOR DEVICE

CROSS-REFERENCE TO RELATED APPLICATIONS/INCORPORATION BY REFERENCE

The present application makes reference to, claims priority to, and claims the benefit of Korean Patent Application No. 10-2013-0083818, filed on Jul. 16, 2013 in the Korean Intellectual Property Office and titled "SEMICONDUCTOR DEVICE," the contents of which are hereby incorporated herein by reference, in their entirety.

FEDERALLY SPONSORED RESEARCH OR DEVELOPMENT

Not Applicable

SEQUENCE LISTING

Not Applicable

MICROFICHE/COPYRIGHT REFERENCE

Not Applicable

BACKGROUND

Present systems, methods and/or architectures for forming stacked electronic packages, for example using support bonding wires, are inadequate. Further limitations and disadvantages of conventional and traditional approaches will become apparent to one of skill in the art, through comparison of such approaches with various aspects of the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

Common reference numerals are used throughout the drawings and the detailed description to indicate the same or similar elements.

DETAILED DESCRIPTION

Figure 1:
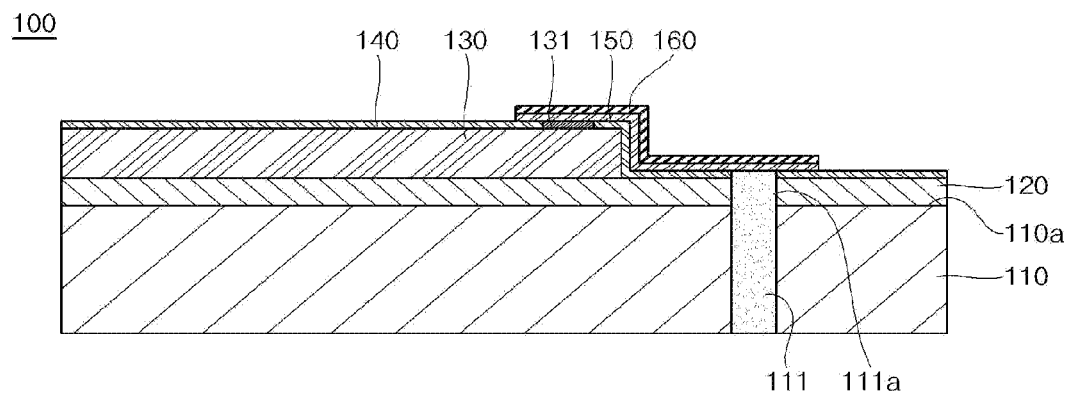
FIG. 1 is a cross-sectional view of a semiconductor device according to an embodiment of the present disclosure.

Various aspects of the present disclosure relate to a semiconductor device and a method for manufacturing thereof, which can facilitate stacking of semiconductor die (or dice) while saving manufacturing cost.

In the field of semiconductor devices, a TSV (Through-Silicon-Via) process generally refers to one of 3D stack package processes in which small holes are formed in a semiconductor die and are filled with a conductor material to electrically connect a plurality of semiconductor die stacked in a sandwich configuration.

Compared to a method of connecting a plurality of semiconductor die by wire bonding, the TSV process is advantageous in view of high speed device operation, low power consumption, and miniaturization, for example because a distance between wires can be considerably reduced.

In a semiconductor die having a through silicon via, it may be advantageous to electrically connect the semiconductor die to a semiconductor die stacked thereon. Furthermore, in a case of forming a semiconductor device in a fine pitch, the complexity of a manufacturing process of the semiconductor device may increase, thereby increasing the manufacturing cost and time.

Various aspects of the present disclosure provide a semiconductor device and a production method thereof, which can facilitate stacking of semiconductor die while saving manufacturing cost.

In various aspects, the present disclosure provides a semiconductor device including a first semiconductor die, a second semiconductor die bonded to a top surface of the first semiconductor die, and a redistribution layer electrically connecting the first semiconductor die to the second semiconductor die, wherein the redistribution layer is formed to extend while surrounding side portions of the second semiconductor die.

The first semiconductor die may, for example, comprise a through silicon via (TSV) protruding from the top surface thereof.

The TSV may, for example, be connected to one end of the redistribution layer.

The TSV may, for example, be horizontally spaced apart from a bond pad of the second semiconductor die.

A passivation layer may, for example, further be formed at a region except for the bond pad of the second semiconductor die between the redistribution layer and the second semiconductor die.

A seed layer having the same shape as the redistribution layer may, for example, further be formed under the redistribution layer.

An additional redistribution layer extending from a bond pad positioned on a top surface of the first semiconductor die or an end of the TSV may, for example, further be formed on one surface of the first semiconductor die to be connected to the redistribution layer.

A passivation layer may, for example, further be formed between the additional redistribution layer and the second semiconductor die.

In other aspects, the present disclosure provides a manufacturing method of a semiconductor device, the manufacturing method, for example, comprising providing a first semiconductor die; forming a first passivation layer on a top surface of the first semiconductor die; bonding a second semiconductor die to a top portion of the first passivation layer; forming a second passivation layer on top surfaces of the first semiconductor die and the second semiconductor die so as to surround side portions of the second semiconductor die; and forming a redistribution layer along the top surfaces of the first semiconductor die and the second semiconductor die.

The bonding of the second semiconductor die may, for example, comprise placing the second semiconductor die on the first passivation layer and performing a reflow process.

The bonding of the second semiconductor die may, for example, comprise allowing a bond pad of the second semiconductor die to be horizontally spaced apart from a bond pad of the first semiconductor die.

The forming of the second passivation layer may, for example, comprise forming the second passivation layer to expose the bond pad of the first semiconductor die or an end of a through silicon via (TSV).

The forming of the second passivation layer may, for example, comprise forming the second passivation layer to expose the bond pad of the first semiconductor die.

The forming of the redistribution layer may, for example, be performed using at least one method selected from electroplating, electroless plating, sputtering and printing.

The manufacturing method may further comprise forming an additional redistribution layer extending from the bond pad of the first semiconductor die or the end of the TSV to be connected to the redistribution layer between the forming of the first passivation layer and the bonding of the second semiconductor die to the upper portion of the first passivation layer.

As described above, in a semiconductor device according to various aspects of the present disclosure, when a second semiconductor die is stacked on a first semiconductor die having a through silicon via (TSV), the TSV and a bond pad of the second semiconductor die are bonded to each other using a redistribution layer, instead of using the bond pad, so that a separate thermal process, such as a reflow process, or a thermal compression process, is not necessarily performed, thereby, for example, preventing a wafer for the first semiconductor die from being bent or being subjected to shocks, and efficiently achieving mounting of the second semiconductor die.

In addition, since an example semiconductor device according to various aspects of the present disclosure might not use solder in a stacking process, a lifetime of the semiconductor device can be increased. Further, since a through silicon via (TSV) of a first semiconductor die and a bond pad of a second semiconductor die can be matched to each other with a relatively low accuracy level, the manufacturing cost of the semiconductor device can be reduced.

Various aspects of the present disclosure will be more apparent from the following detailed description taken in conjunction with the accompanying drawings.

Hereinafter, examples of various embodiments of the disclosure will be described in detail with reference to the accompanying drawings such that they can readily be made and used by those skilled in the art.

FIG. 1 is a cross-sectional view of a semiconductor device according to an embodiment of the present disclosure.

Referring to FIG. 1, the semiconductor device 100 according to an embodiment of the present disclosure comprises a first semiconductor die 110, a first passivation layer 120, a second semiconductor die 130, a second passivation layer 140, and a redistribution layer 160. Here, a seed layer 150 for forming the redistribution layer 160 may further be formed under the redistribution layer 160.

The first semiconductor die 110 comprises a bond pad (not shown) on its first surface, and a through silicon via (TSV) 111 connected to the bond pad and passing through the first semiconductor die 110 in a thickness direction. An end 111a of the TSV 111 protrudes through a second surface 110a opposite to a first surface of the first semiconductor die 110.

The TSV 111 is connected to the bond pad of the first semiconductor die 110, forming a path for transmitting electrical signals between the second surface 110a of the first semiconductor die 110 and the bond pad.

The first passivation layer 120 is formed along the second surface 110a of the first semiconductor die 110. However, the first passivation layer 120 is formed to have a thickness smaller than a height of the TSV 111 protruding from the second surface 110a of the first semiconductor die 110. Therefore, the first passivation layer 120 insulates the second surface 110a of the first semiconductor die 110 while exposing the end 111a of the TSV 111.

In addition, the first passivation layer 120 may be formed on the second surface 110a of the first semiconductor die 110 in a semi-cured state (B-stage). Therefore, in such an example scenario, the second semiconductor die 130 may be adhered to the second surface 110a of the first semiconductor die 110 without using a separate adhesive in stacking the second semiconductor die 130. In addition, the first passivation layer 120 may be cured through a reflow process that maintains the second semiconductor die 130 at an adhered state.

The second semiconductor die 130 is formed (e.g., positioned) on the second surface 110a of the first semiconductor die 110. The second semiconductor die 130 may, for example, be smaller than the first semiconductor die 110 in size. Further, the second semiconductor die 130 may be positioned inwards relative to the TSV 111 of the first semiconductor die 110 (or, e.g., some or all TSVs that are electrically connected to the second semiconductor die 130). The second semiconductor die 130 may, for example, be positioned between TSVs of the first semiconductor die 110 (e.g., surrounded on 2, 3, or 4 sides by the TSVs of the first semiconductor die 110, for example all of the TSVs or the TSVs that are electrically connected to the first semiconductor die 110). The second semiconductor die 130 is not necessarily provided with a separate TSV and may comprise a bond pad 131 on its surface opposite to a surface contacting the first semiconductor die 110. The second semiconductor die 130 may be maintained at the adhered state by the first passivation layer 120 positioned between the second surface 110a of the first semiconductor die 110 and the second semiconductor die 130. In addition, as will later be described, the second semiconductor die 130 may be formed to have a thickness of 20 μm or less, for example for enhancing formation of the seed layer 150 and the redistribution layer 160.

The second passivation layer 140 may, for example, be formed on a surface having the bond pad 131 of the second semiconductor die 130 formed thereon. The second passivation layer 140 may, for example, be formed to surround side portions of the bond pad 131 to expose a top surface of the bond pad 131. To this end, the second passivation layer 140 may be formed to have a thickness smaller than that of the bond pad 131 of the second semiconductor die 130 or corresponding to a height of the bond pad 131.

In addition, the second passivation layer 140 may, for example, be formed to cover side portions of the second semiconductor die 130 and extend from the side portions to cover the second surface 110a of the first semiconductor die 110 (or, e.g., a portion thereof that is not covered by the second semiconductor die 130). For example, the second passivation layer 140 may be formed on the first passivation layer 120 formed on the second surface 110a of the first semiconductor die 110. A sum of thicknesses of the first passivation layer 120 and the second passivation layer 140 may be smaller than or equal to a height of the end 111a of the TSV 111 protruding from the first semiconductor die 110.

Therefore, the end 111a of the TSV 111 may be exposed to an upper portion of the second passivation layer 140.

The seed layer 150 may, for example, be formed along the second semiconductor die 130 and the first semiconductor die 110. The seed layer 150 may, for example, be formed to extend from the bond pad 131 of the second semiconductor die 130 to the end 111a of the TSV 111 of the first semiconductor die 110 (e.g., covering at least a portion of the bond pad 131 and at least a portion of the end 111a of the TSV 111). Further for example, the seed layer 150 may be formed to surround stepped portions formed along peripheral sides of the second semiconductor die 130. The seed layer 150 may, for example, be generally made of copper (Cu). The redistribution layer 160 may then be formed on the seed layer 150.

The redistribution layer 160 may, for example, be formed along the seed layer 150. After the seed layer 150 is formed, the redistribution layer 160 may, for example, be formed by electroplating. In a case where the seed layer 150 is not formed, the redistribution layer 160 may, for example, be formed by electroless plating. The redistribution layer 160 may, for example, connect a bond pad 131 of the second semiconductor die 130 and the end 111a of the TSV 111 of the first semiconductor die 110 to each other. Therefore, the redistribution layer 160 may electrically connect the first semiconductor die 110 and the second semiconductor die 130 to each other.

In addition, since solder-based bonding need not be employed when the seed layer 150 and the redistribution layer 160 are formed, it is not necessary to perform a separate thermal process, such as a reflow process, or a thermal compression process to perform the connection. Therefore, it is possible to prevent a wafer for the first semiconductor die 110 from being bent or being subjected to shocks during the thermal process, while readily achieving mounting of the second semiconductor die 130.

In addition, in the semiconductor device 100 according to the embodiment of the present disclosure, the redistribution layer 160 may be used in a stacking process, instead of using solder, thereby increasing a lifetime of the semiconductor device 100. Further, since the TSV 111 of the first semiconductor die 110 and the bond pad 131 of the second semiconductor die 130 can be matched to each other with a relatively low accuracy level, the manufacturing cost of the semiconductor device can be reduced.

Hereinafter, a semiconductor device according to another embodiment of the present disclosure will be described.

Figure 2:
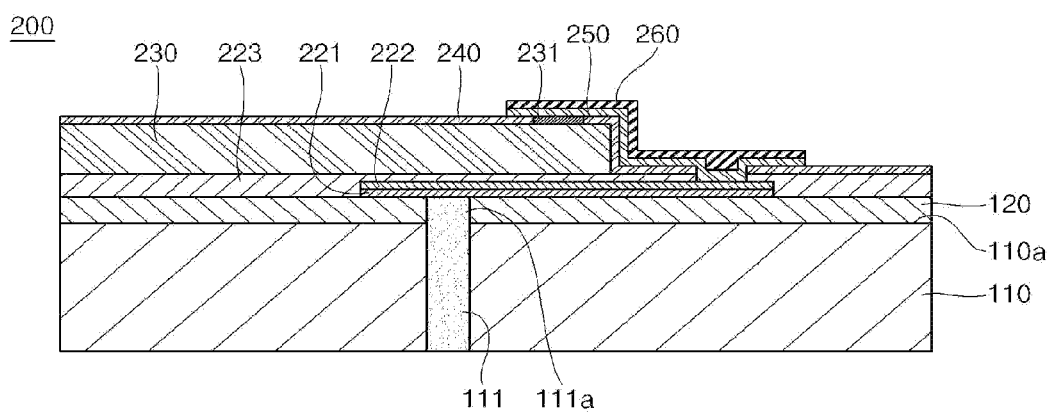
FIG. 2 is a cross-sectional view of a semiconductor device according to another embodiment of the present disclosure.

FIG. 2 is a cross-sectional view of a semiconductor device according to another embodiment of the present disclosure.

In FIG. 2, elements having the same configuration and function as those of the previous embodiment are denoted by the same reference numerals and the following description will focus on differences between the present and previous embodiments of the present disclosure.

Referring to FIG. 2, the semiconductor device 200 according to another embodiment of the present disclosure comprises a first semiconductor die 110, a first passivation layer 120, a first redistribution layer 222, a second passivation layer 223, a second semiconductor die 230, a third passivation layer 240, and a redistribution layer 260. Here, a first seed layer 221 may further be formed under the first redistribution layer 222, and a second seed layer 250 may further be formed under the second redistribution layer 260.

The first seed layer 221 may, for example, be formed on the first passivation layer 120. The first seed layer 221 may, for example, be formed to extend in a region of the first passivation layer 120, specifically from the end 111a of the TSV 111 of the first semiconductor die 110 to edges (or edge regions) of the first semiconductor die 110 to then be electrically connected to the TSV 111.

The first redistribution layer 222 may, for example, be formed on the first seed layer 221. The first redistribution layer 222 may, for example, formed in the same shape as the first seed layer 221 and is electrically connected to the TSV 111 of the first semiconductor die 110.

The second passivation layer 223 may, for example, be formed on the first redistribution layer 222 to cover a region of the first redistribution layer 222. The second passivation layer 223 may, for example, expose an upper portion of the first redistribution layer 222, specifically a portion of an outer edge area relative to a potential region where the second semiconductor die 230 is to be formed (or positioned). Therefore, even when the second semiconductor die 230 is stacked on (or over) the first redistribution layer 222, the first redistribution layer 222 may be exposed to the outside. In addition, like the first passivation layer 120 of semiconductor device 100 according to the embodiment of the present disclosure, the second passivation layer 223 is also formed in a B-stage, and the second semiconductor die 230 may be adhered to a top portion of the first semiconductor die 110 without a separate adhesive.

The second semiconductor die 230 is formed (e.g., positioned) on the first semiconductor die 110. The second semiconductor die 230 may, for example, be sized such that its lateral edge is positioned at the outer side (in the right side of FIG. 2) relative to the TSV 111 of the first semiconductor die 110. In addition, the second semiconductor die 230 may have a bond pad 231 formed thereon, and the bond pad 231 may be electrically connected to the first semiconductor die 110 through the second seed layer 250 and the second redistribution layer 260.

The third passivation layer 240 may be formed along (e.g., over) the second passivation layer 223 and formed on (e.g., over) the second semiconductor die 230 and the first semiconductor die 110. Here, the third passivation layer 240 may, for example, have a thickness smaller than or equal to a height of the bond pad 231 of the second semiconductor die 230, so that the bond pad 231 of the second semiconductor die 230 may be exposed to an upper portion of the third passivation layer 240.

The second seed layer 250 may, for example, be formed on the third passivation layer 240. The second seed layer 250 may, for example, extend to the bond pad 231 of the second semiconductor die 230 and the exposed portion of the first redistribution layer 222. Therefore, the second seed layer 250 may electrically connect the second semiconductor die 230 and the first semiconductor die 110 to each other.

The redistribution layer 260 may, for example, be formed along the second seed layer 250. The redistribution layer 260 connects in cooperation with the second seed layer 250 the bond pad 231 of the second semiconductor die 240 and the TSV 111 of the first semiconductor die 110 to each other. The redistribution layers 222 and 260 reduce a length limit of the second semiconductor die 230 in cooperation with the seed layer s 221 and 250, thereby facilitating stacking of the second semiconductor die 230 having variable sizes.

Hereinafter, a manufacturing method of a semiconductor device according to an embodiment of the present disclosure will be described.

Figure 3:
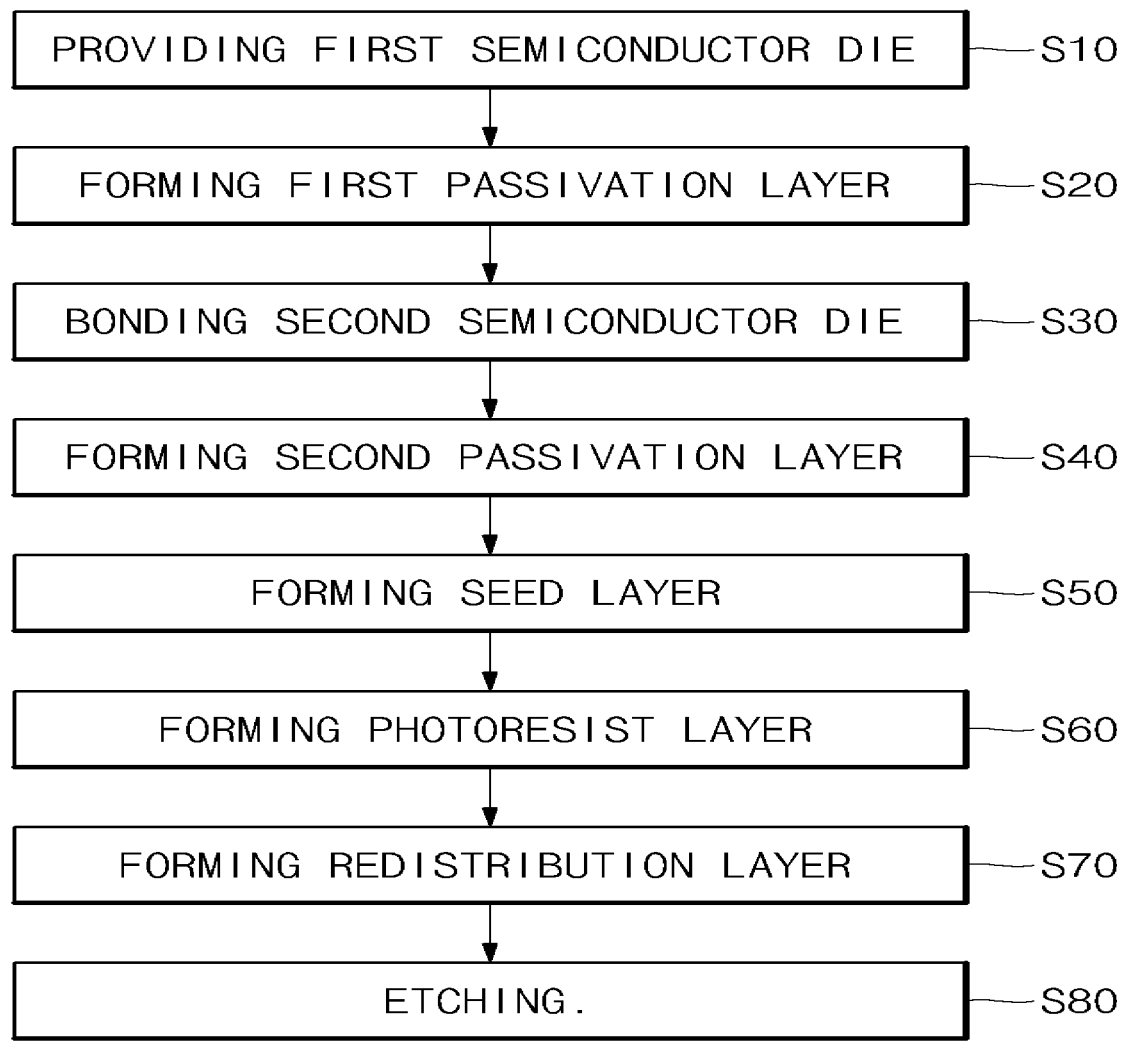
FIG. 3 is a flowchart of a manufacturing method of a semiconductor device according to an embodiment of the present disclosure.

FIG. 3 is a flowchart of a manufacturing method of a semiconductor device according to an embodiment of the present disclosure and FIGS. 4A to 4I illustrate a manufacturing method of a semiconductor device according to an embodiment of the present disclosure.

Referring to FIG. 3, the manufacturing method of a semiconductor device according to an embodiment of the present disclosure may comprise providing a first semiconductor die (S10), forming a first passivation layer (S20), bonding a second semiconductor die (S30), forming a second passivation layer (S40), forming a photoresist layer (S60), forming a redistribution layer (S70), and etching (S80). In addition, the manufacturing method may further comprise forming a seed layer (S50) between the forming of the second passivation layer (S40) and the forming of the photoresist layer (S60). Hereinafter, the respective steps of FIG. 3 will be described in detail with reference to FIGS. 4A to 4I.

Figure 4A:
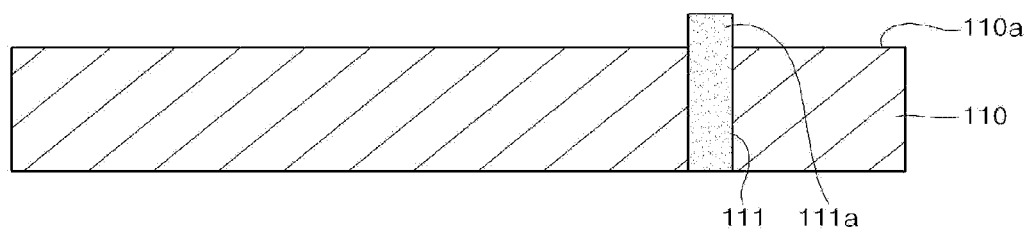
FIGS. 4A to 4I illustrate a manufacturing method of a semiconductor device according to an embodiment of the present disclosure.

Referring to FIGS. 3 and 4A, in the providing of the first semiconductor die (S10), a first semiconductor die 110 is provided, the first semiconductor die 110 having an end 111a of a TSV 111 protruding on a second surface 110a opposite to a first surface having a bond pad (not shown) formed thereon. The first semiconductor die 110 may, for example, be provided in the form of a wafer, and the TSV 111 may be formed along the thickness of the first semiconductor die 110 to be exposed to the outside of the second surface 110a.

Figure 4B:
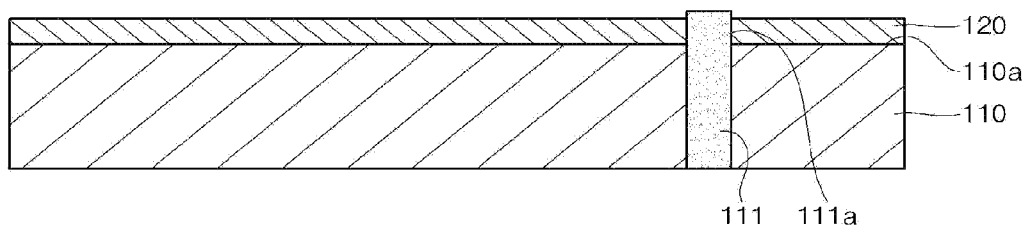

Referring to FIGS. 3 and 4B, in the forming of the first passivation layer (S20), a first passivation layer 120 may be formed on the second surface 110a of the first semiconductor die 110. The first passivation layer 120 may, for example, be made of polyimide and may be formed along the second surface 110a, such that the end 111a of the TSV 111 protrudes relative to the first passivation layer 120 to be exposed. In addition, the first passivation layer 120 may, for example, be formed on the first semiconductor die 110 in a B-stage.

Figure 4C:
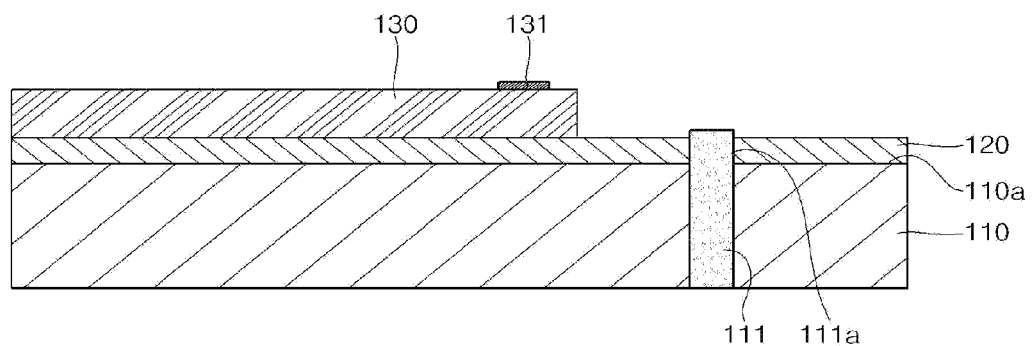

Referring to FIGS. 3 and 4C, in the bonding of the second semiconductor die (S30), the second semiconductor die 130 may, for example, be adhered to a top portion of the first semiconductor die 110 to be bonded to the first semiconductor die 110. Since the first passivation layer 120 formed on the second surface 110a of the first semiconductor die 110 may, for example, be in the B-stage, the second semiconductor die 130 may be adhered to the first semiconductor die 110 without using a separate adhesive. In addition, in a step that might increase bonding capacity of the second semiconductor die 130, the first passivation layer 120 may, for example, be cured through a reflow process.

Figure 4D:
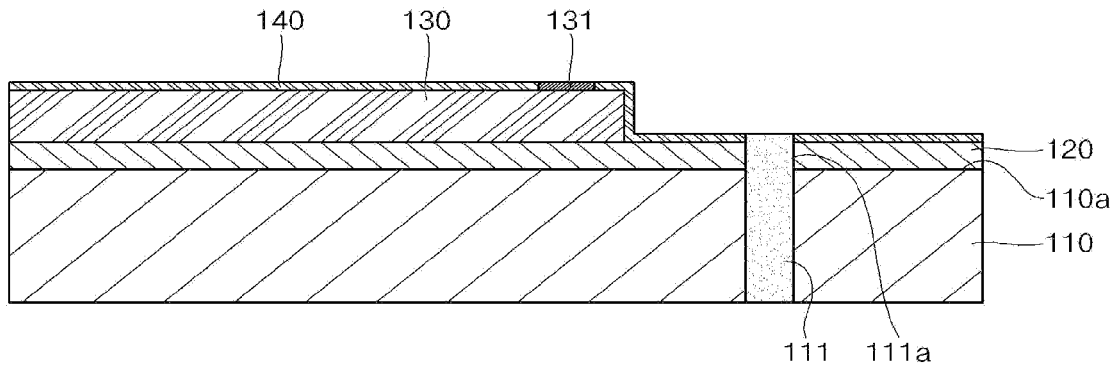

Referring to FIGS. 3 and 4D, in the forming of the second passivation layer (S40), a second passivation layer 140 may be formed along the second semiconductor die 130 and the first semiconductor die 110. The second passivation layer 140 may, for example, be made of polyimide and may be formed to surround side portions of the second semiconductor die 130. In addition, the second passivation layer 140 may, for example, be formed to expose the bond pad 131 of the second semiconductor die 130 and the end 111a of the TSV 111 of the first semiconductor die 110.

Figure 4E:
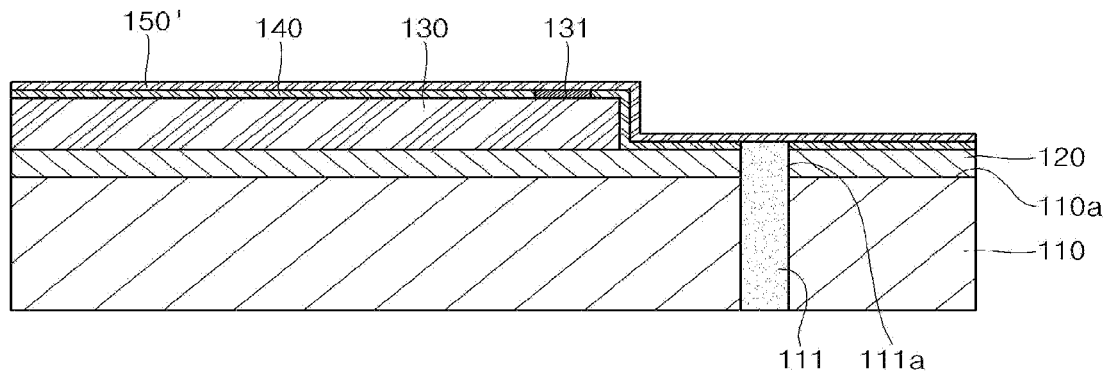

Referring to FIGS. 3 and 4E, in the forming of the seed layer (S50), a seed layer 150' may be formed along the second semiconductor die 130 and the first semiconductor die 110. The seed layer 150' may, for example, be formed along top surfaces of the stacked semiconductor die 110 and 130 and may, for example, be generally formed using copper (Cu).

Figure 4F:
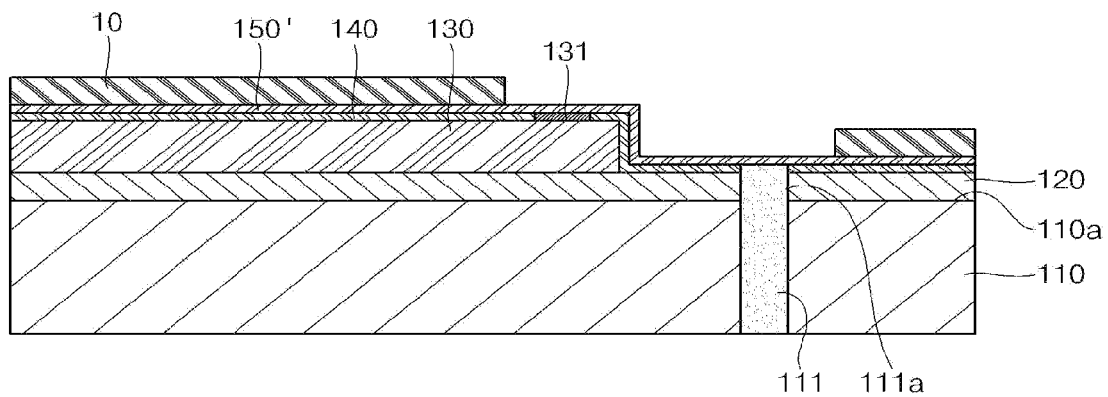

Referring to FIGS. 3 and 4F, in the forming of the photoresist layer (S60), a photoresist layer 10 may be formed to be patterned on a region of an upper region of the seed layer 150', the region excluding a region where a redistribution layer is to be formed. The photoresist layer 10 may, for example, be formed by a general masking process. In addition, the photoresist layer 10 exposes a region ranging from the end 111a of the TSV 111 of the first semiconductor die 110 to the bond pad 131 of the second semiconductor die 130.

Figure 4G:
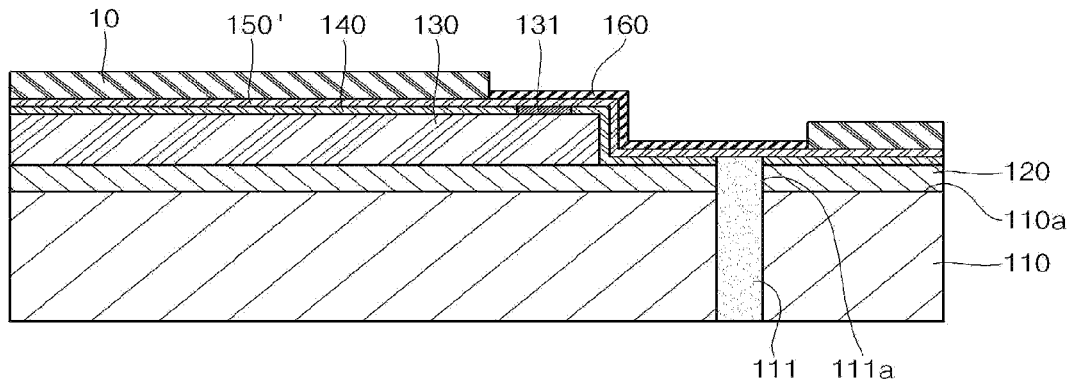

Referring to FIGS. 3 and 4G, in the forming of the redistribution layer (S70), a redistribution layer 160 may, for example, be formed by electroplating using the seed layer 150' exposed between patterns of the photoresist layer 10. The redistribution layer 160 may, for example, be generally made of gold (Au), silver (Ag) or copper (Cu). In an example case where the seed layer 150' is not formed, the redistribution layer 160 may also be formed, for example by electroless plating, sputtering or printing. In addition, the redistribution layer 160 may electrically connect the end 111a of the TSV 111 of the first semiconductor die 110 to the bond pad 131 of the second semiconductor die 130.

Figure 4H:
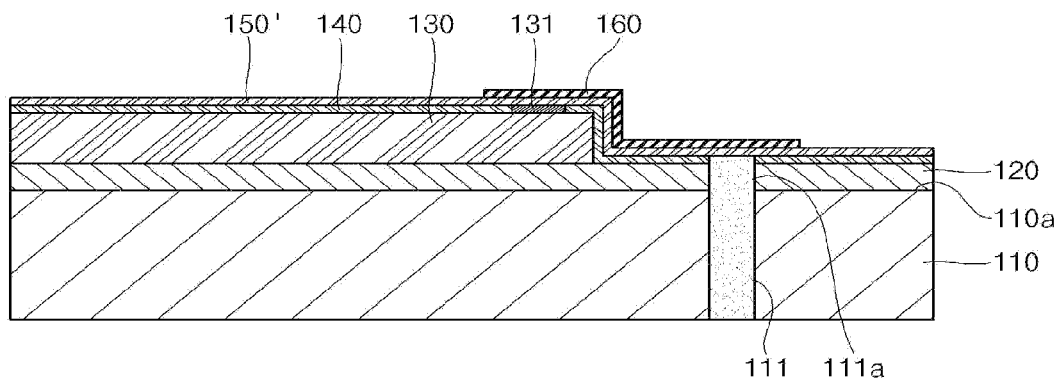
Figure 4I:
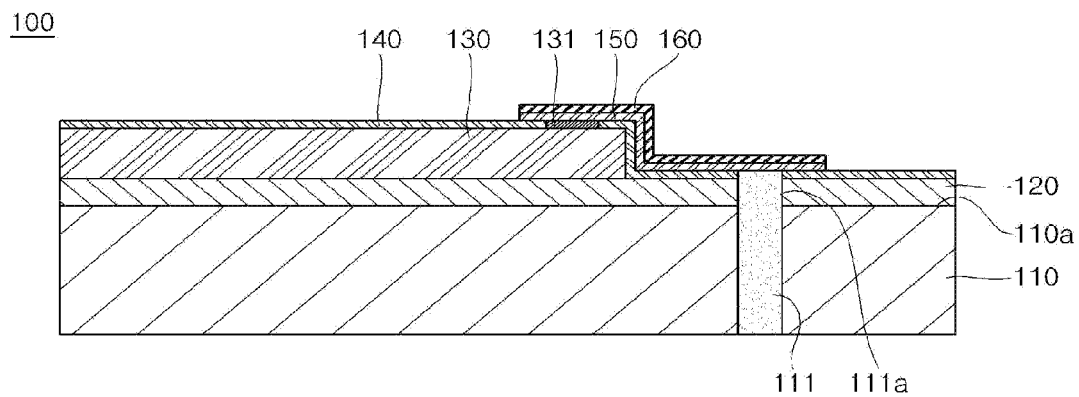

Referring to FIGS. 3, 4H and 4I, in the etching (S80), the photoresist layer 10 may, for example, be removed by ashing, while leaving only a portion of the seed layer 150' positioned under the redistribution layer 160, the remaining portion of the seed layer 150' is etched for removal. The etching of the seed layer 150' may, for example, be achieved based on an etch rate difference. Finally, an ultimately formed seed layer 150 and the redistribution layer 160 may be formed to have the same shape.

Hereinafter, a manufacturing method of a semiconductor device according to another embodiment of the present disclosure will be described.

Figure 5:
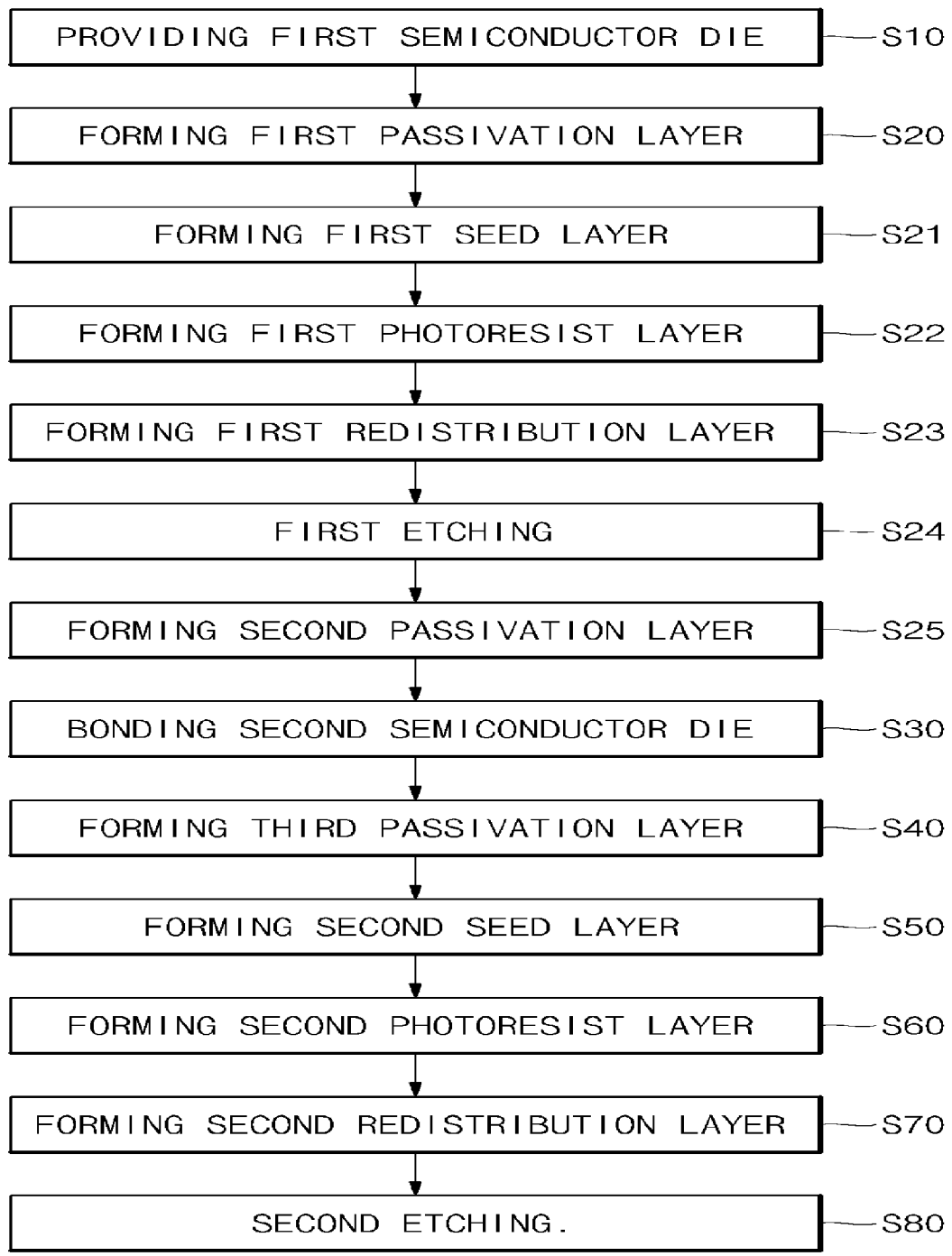
FIG. 5 is a flowchart of a manufacturing method of a semiconductor device according to another embodiment of the present disclosure.
Figure 6A:
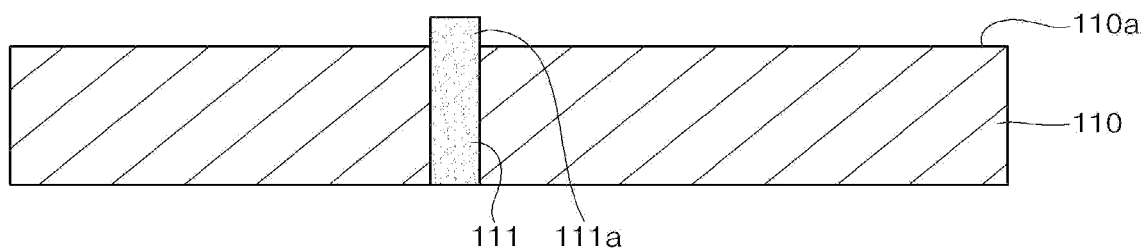
FIGS. 6A to 6N illustrate a manufacturing method of a semiconductor device according to another embodiment of the present disclosure.
Figure 6B:
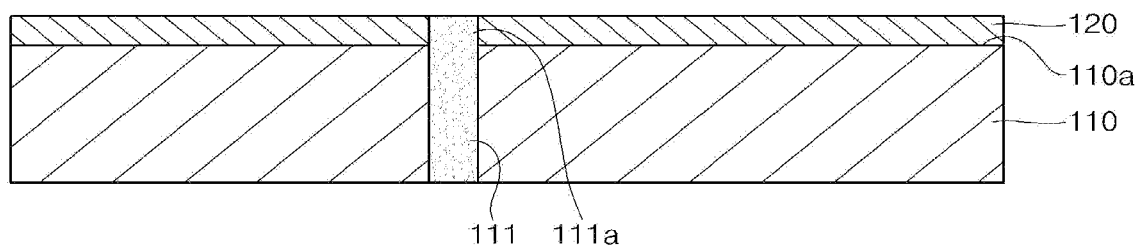
Figure 6C:
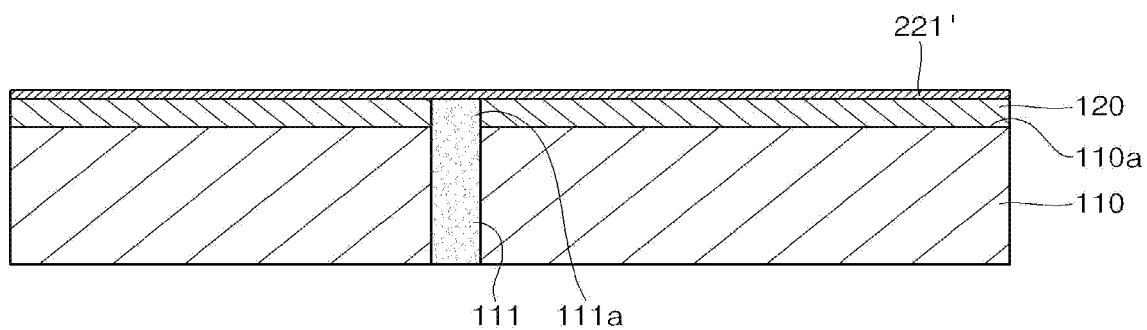
Figure 6D:
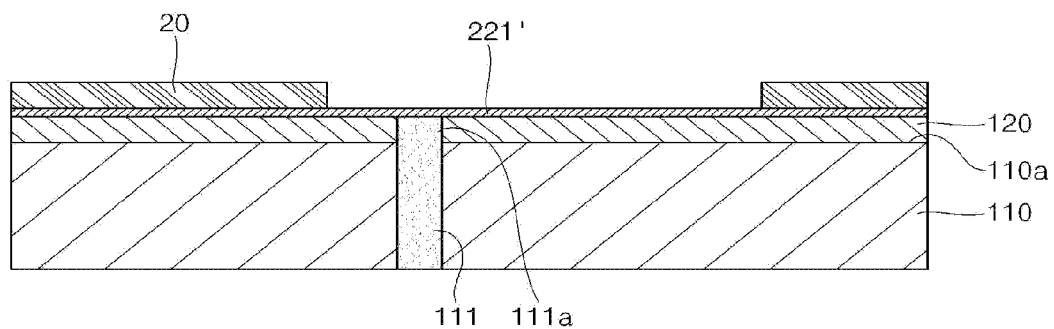
Figure 6E:
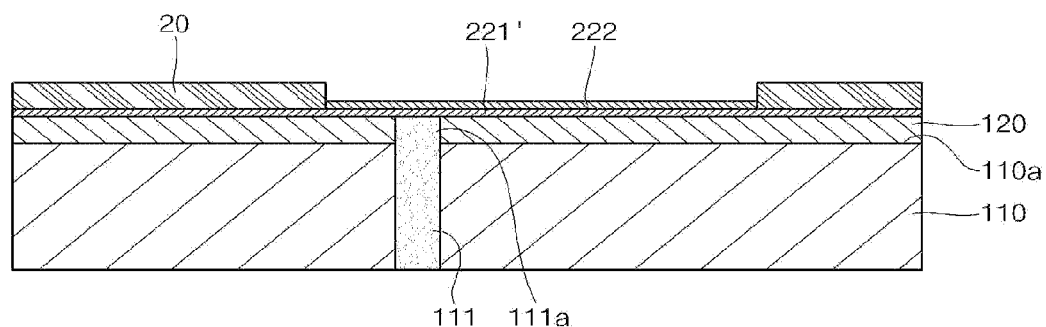
Figure 6F:
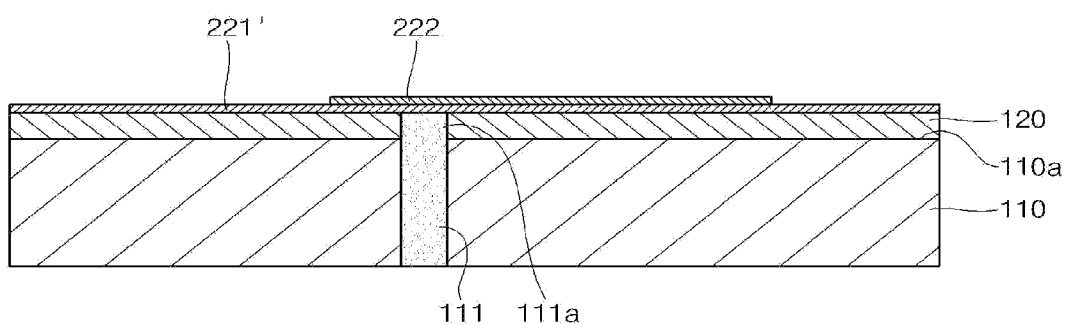
Figure 6G:
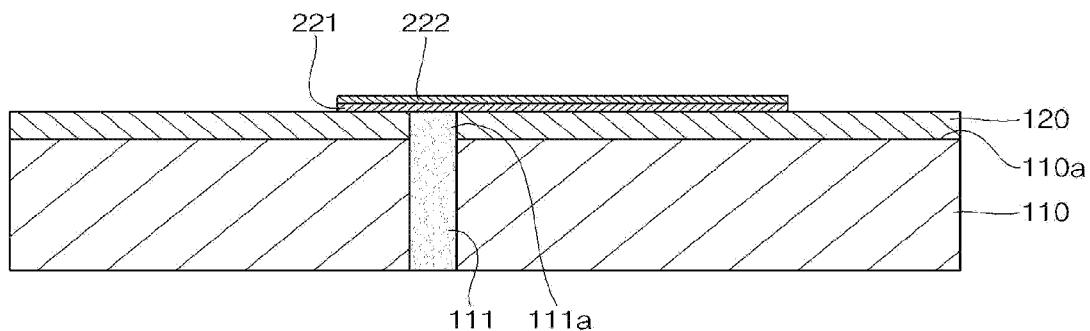
Figure 6H:
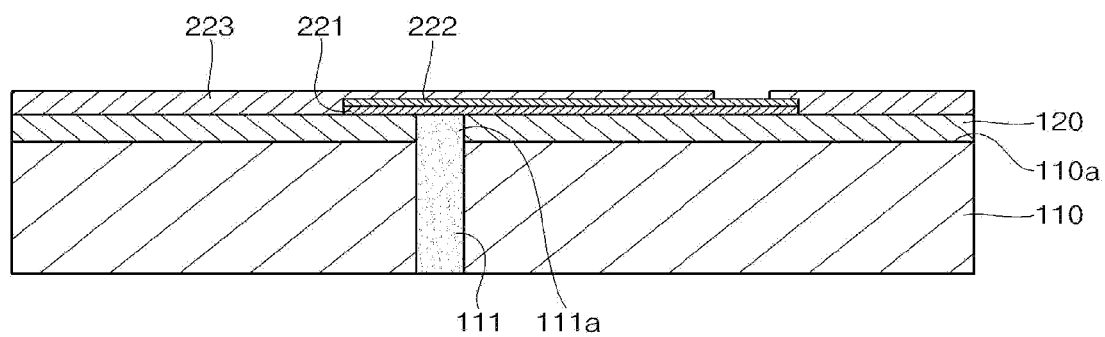
Figure 6I:
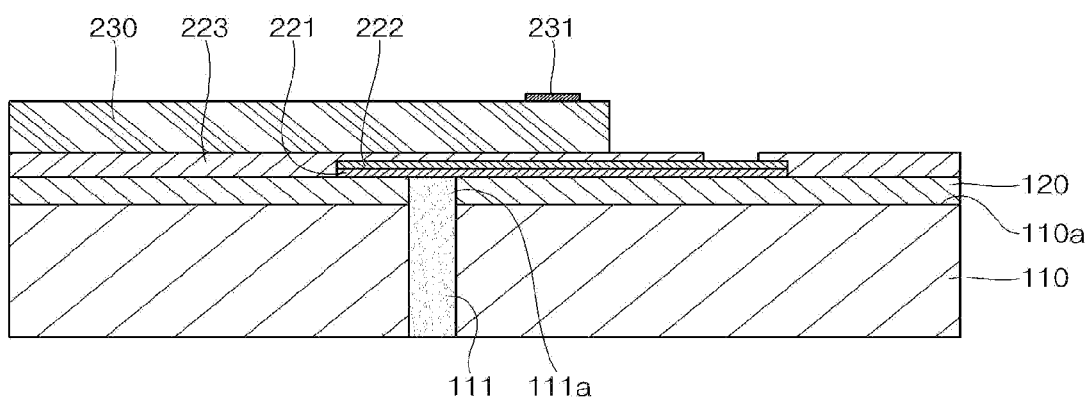
Figure 6J:
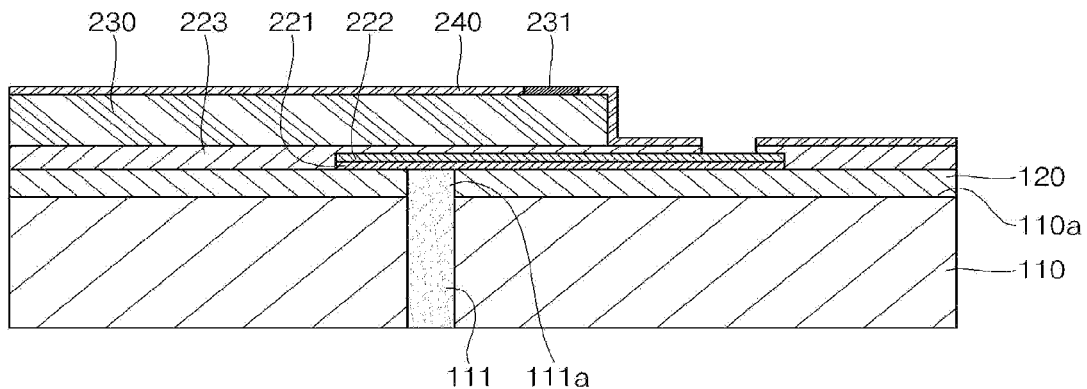
Figure 6K:
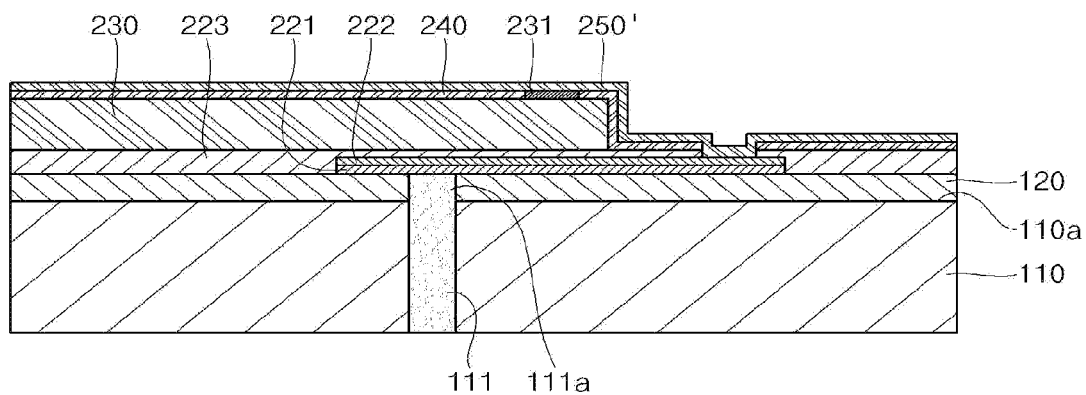
Figure 6L:
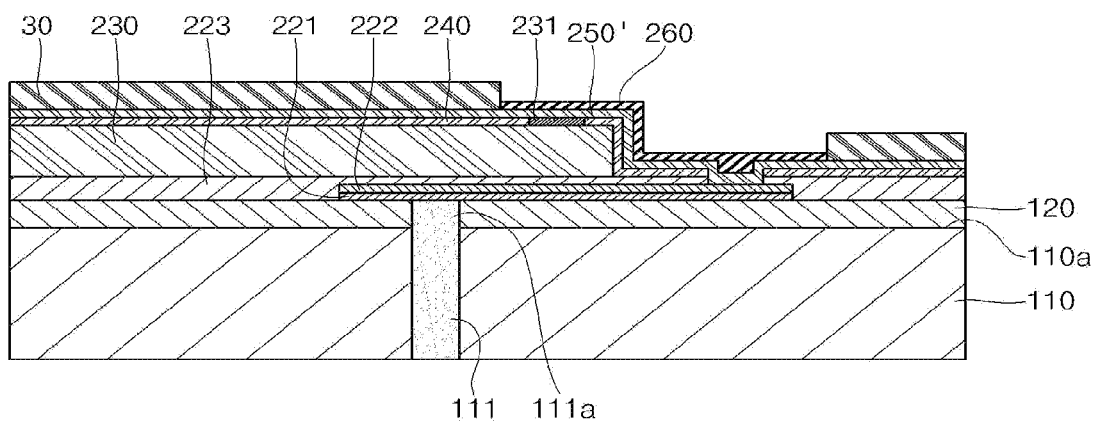
Figure 6M:
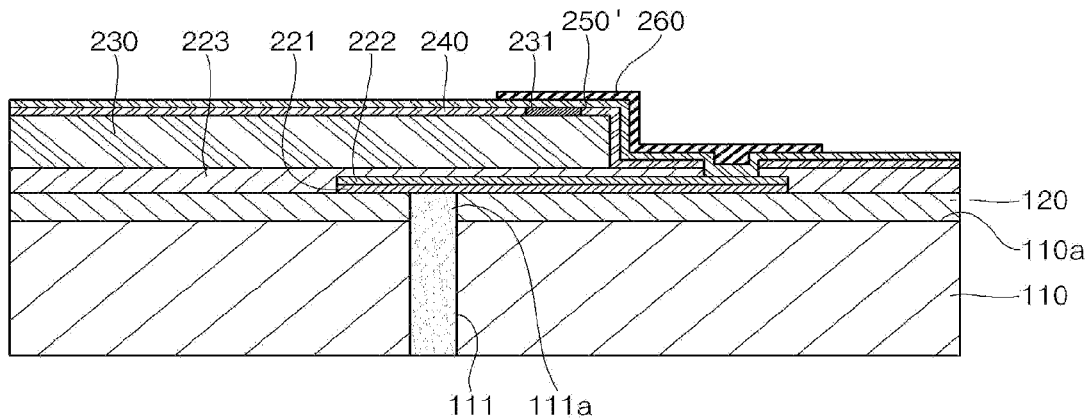
Figure 6N:
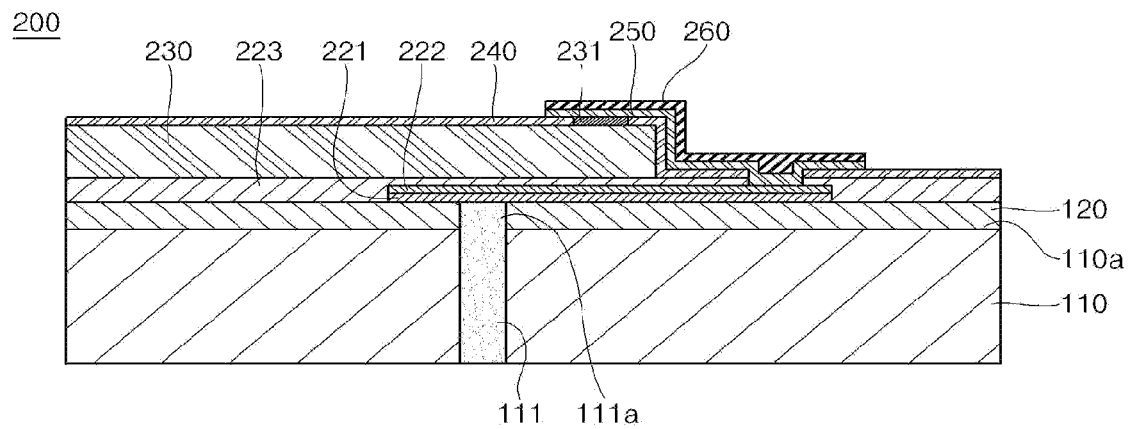

FIG. 5 is a flowchart of a manufacturing method of a semiconductor device according to another embodiment of the present disclosure, and FIGS. 6A to 6N illustrate a manufacturing method of a semiconductor device according to another embodiment of the present disclosure.

Referring to FIG. 5, the manufacturing method of a semiconductor device 200 according to another embodiment of the present disclosure may comprise providing a first semiconductor die (S10), forming a first passivation layer (S20), forming a first seed layer 221 (S21), forming a first photoresist layer (S22), forming a first redistribution layer (S23), first etching (S24), forming a second passivation layer (S25), bonding a second semiconductor die (S30), forming a third passivation layer (S40), forming a second seed layer (S50), forming a second photoresist layer (S60), forming a second redistribution layer (S70), and second etching (S80). Hereinafter, the respective steps of FIG. 5 will be described in detail with reference to FIGS. 6A to 6N.

Referring to FIGS. 5 and 6A, in the providing of the first semiconductor die (S10), a first semiconductor die 110 may be provided, the first semiconductor die 110 having an end 111a of a TSV 111 protruding on a second surface 110a opposite to a first surface having a bond pad (not shown) formed thereon.

Referring to FIGS. 5 and 6B, in the forming of the first passivation layer (S20), a first passivation layer 120 may be formed on the second surface 110a of the first semiconductor die 110. The first passivation layer 120 may, for example, be made of polyimide and is formed along the second surface 110a, such that the end 111a of the TSV 111 protrudes relative to the first passivation layer 120 to be exposed (e.g., protruding above the first passivation layer 120, or level with the first passivation layer 120 so the upper face of the TSV end 111a is exposed).

Referring to FIGS. 5 and 6C, in the forming of the first seed layer (S21), a first seed layer 221' may be formed on the first passivation layer 120. The first seed layer 221' is generally made of copper (Cu) and may, for example, be formed on the entire surface of the first semiconductor die 110.

Referring to FIGS. 5 and 6D, in the forming of the first photoresist layer (S22), a first photoresist layer 20 may be formed to be patterned on the first seed layer 221'. The first photoresist layer 20 may, for example, be formed on only a region of the first seed layer 221', the region excluding a region where a first redistribution layer is to be formed.

Referring to FIGS. 5 and 6E, in the forming of the first redistribution layer (S23), a first redistribution layer 222 may, for example, be formed between patterns of the first photoresist layer 20, for example using a metal, such as gold (Au), silver (Ag) or copper (Cu). The first redistribution layer 222 may also be formed by electroplating. However, in a case where the first seed layer 221' is not formed, the first redistribution layer 222 may also, for example, be formed by electroless plating, sputtering or printing.

Referring to FIGS. 5, 6F and 6G, in the first etching (S24), the first photoresist layer 20 may be removed and the first seed layer 221' etched, thereby forming an ultimate seed layer 221 and the first redistribution layer 222 so as to have the same shape.

Referring to FIGS. 5 and 6H, in the forming of the second passivation layer (S25), a second passivation layer 223 may be formed along the first semiconductor die 110. The second passivation layer 223 may, for example, be formed to surround the first redistribution layer 222. Here, the second passivation layer 223 may be formed to expose a portion of the first redistribution layer 222, for example only a region to later be connected to the second semiconductor die 230 by a second redistribution layer. In addition, the second passivation layer 223 may, for example, be made of polyimide and may be in a B-stage.

Referring to FIGS. 5 and 6I, in the bonding of the second semiconductor die (S30), the second semiconductor die 230 may be bonded to a top portion of the second passivation layer 223. In a step that might increase bonding capacity of the second semiconductor die 230, a reflow process may be performed later.

Referring to FIGS. 5 and 6J, in the forming of the third passivation layer (S40), a third passivation layer 240 may be formed along top surfaces of the first semiconductor die 110 and the second semiconductor die 230. The third passivation layer 240 may, for example, be formed to surround side portions of the second semiconductor die 230. In addition, the third passivation layer 240 may be formed to expose a bond pad 231 of the second semiconductor die 230. In addition, the third passivation layer 240 may, for example, be formed to expose a portion of the first redistribution layer 222 formed on the first semiconductor die 110.

Referring to FIGS. 5 and 6K, in the forming of the second seed layer (S50), a second seed layer 250' may be formed on the entire surface of the third passivation layer 240. The second seed layer 250' may, for example, be made of copper (Cu).

Referring to FIGS. 5 and 6L, in the forming of the second photoresist layer (S60), a second photoresist layer 30 may be formed on the second seed layer 250'. The second photoresist layer 30 may, for example, be patterned to expose only a region where a second redistribution layer is to be formed.

Referring again to FIGS. 5 and 6L, in the forming of the second redistribution layer (S70), a second redistribution layer 260 may, for example, be formed between patterns of the second photoresist layer 30 by electroplating. However, in a case where the second seed layer 250' is not formed, the second redistribution layer 260 may, for example, be formed by electroless plating, sputtering or printing.

Referring to FIGS. 5, 6M and 6N, in the second etching (S80), the second photoresist layer 30 may, for example, be removed by ashing, while leaving only a portion of the second seed layer 250' positioned under the second redistribution layer 260, the remaining portion of the second seed layer 250' may be etched for removal. Accordingly, the ultimately formed second seed layer 250 and the second redistribution layer 260 are formed to have the same shape.

This disclosure provides the semiconductor device and the manufacturing method thereof according to example embodiments. The scope of the present disclosure is not limited by these exemplary embodiments. Numerous variations, whether explicitly provided for by the specification or implied by the specification, such as variations in structure, dimension, type of material and manufacturing process, may be implemented by one skilled in the art in view of this disclosure without departing from the spirit and scope of the present disclosure, for example as set forth in the following claims.

What is claimed is:

1. A semiconductor device comprising:
   a first semiconductor die comprising a top surface, a bottom surface, and a plurality of side surfaces connecting the top and bottom surfaces of the first semiconductor die;
   a second semiconductor die comprising a top surface, a bottom surface, and a plurality of side surfaces connecting the top and bottom surfaces of the second semiconductor die, where the bottom surface of the second semiconductor die is bonded to the top surface of the first semiconductor die;
   a passivation layer formed on the top surface of the second semiconductor die, on at least one of the plurality of side surfaces of the second semiconductor die, and on a portion of the top surface of the first semiconductor die that is not covered by the second semiconductor die, where the passivation layer is thinner than the second semiconductor die; and
   at least one redistribution layer electrically connecting an electrical conductor at the top surface of the first semiconductor die and an electrical contact on the top surface of the second semiconductor die.

2. The semiconductor device of claim 1, wherein the at least one redistribution layer extends horizontally over the top surfaces of the first and second semiconductor die, and the at least one redistribution layer extends vertically along one of the plurality of side surfaces of the second semiconductor die.

3. The semiconductor device of claim 2, wherein a redistribution layer of the at least one redistribution layer follows a contour of the second semiconductor die and the first semiconductor die, the followed contour running from the electrical contact on the top surface of the second semiconductor die to the electrical conductor at the top surface of the first semiconductor die.

4. A semiconductor device comprising:
   a first semiconductor die comprising a top surface, a bottom surface, and a plurality of side surfaces connecting the top and bottom surfaces of the first semiconductor die;
   a second semiconductor die comprising a top surface, a bottom surface, and a plurality of side surfaces connecting the top and bottom surfaces of the second semiconductor die, where the bottom surface of the second semiconductor die is bonded to the top surface of the first semiconductor die; and
   a redistribution layer electrically connecting an electrical conductor at the top surface of the first semiconductor die and an electrical contact on the top surface of the second semiconductor die, the redistribution layer connected to the electrical conductor at the top surface of the first semiconductor die and the electrical contact on the top surface of the second semiconductor die, wherein the electrical conductor at the top surface of the first semiconductor die is a conductive via that extends completely through the first semiconductor die.

5. The semiconductor device of claim 4, wherein the redistribution layer extends horizontally over the top surfaces of the first and second semiconductor die, and the redistribution layer extends vertically along one of the plurality of side surfaces of the second semiconductor die.

6. The semiconductor device of claim 5, wherein a portion of the redistribution layer is plated along the one of the plurality of side surfaces of the second semiconductor die.

7. The semiconductor device of claim 4, wherein the conductive via is located under the second semiconductor die.

8. The semiconductor device of claim 4, wherein the first and second semiconductor die are bonded together with a single passivation layer, a first portion of which is positioned between the first and second semiconductor die and a second portion of which is not positioned between the first and second semiconductor die.

9. A semiconductor device comprising:
a first semiconductor die comprising a top surface, a bottom surface, and a plurality of side surfaces connecting the top and bottom surfaces of the first semiconductor die;
a second semiconductor die comprising a top surface, a bottom surface, and a plurality of side surfaces connecting the top and bottom surfaces of the second semiconductor die, where the bottom surface of the second semiconductor die is bonded to the top surface of the first semiconductor die;
a redistribution layer electrically connecting an electrical conductor at the top surface of the first semiconductor die and an electrical contact on the top surface of the second semiconductor die, the redistribution layer connected to the electrical conductor at the top surface of the first semiconductor die and the electrical contact on the top surface of the second semiconductor die;
a first passivation layer formed over the first semiconductor die, where a first portion of the first passivation layer is covered by the second semiconductor die, and a second portion of the first passivation layer is not covered by the second semiconductor die; and
a second passivation layer formed over the second semiconductor die and over the second portion of the first passivation layer, where the second passivation layer is thinner than the second semiconductor die.

10. A semiconductor device comprising:
a first semiconductor die comprising a top surface, a bottom surface, and a plurality of side surfaces connecting the top and bottom surfaces of the first semiconductor die;
a second semiconductor die comprising a top surface, a bottom surface, and a plurality of side surfaces connecting the top and bottom surfaces of the second semiconductor die, where the bottom surface of the second semiconductor die is bonded to the top surface of the first semiconductor die; and
a redistribution layer electrically connecting an electrical conductor at the top surface of the first semiconductor die and an electrical contact on the top surface of the second semiconductor die, the redistribution layer connected to the electrical conductor at the top surface of the first semiconductor die and the electrical contact on the top surface of the second semiconductor die,
wherein the redistribution layer extends horizontally over the top surfaces of the first and second semiconductor die, and the redistribution layer extends vertically along one of the plurality of side surfaces of the second semiconductor die, and
wherein the redistribution layer follows a contour of the second semiconductor die and the first semiconductor die, the followed contour running from the electrical contact on the top surface of the second semiconductor die to the electrical conductor at the top surface of the first semiconductor die.

11. A semiconductor device comprising:
a first semiconductor die comprising a top surface, a bottom surface, and a plurality of side surfaces connecting the top and bottom surfaces of the first semiconductor die;
a second semiconductor die comprising a top surface, a bottom surface, and a plurality of side surfaces connecting the top and bottom surfaces of the second semiconductor die, where the bottom surface of the second semiconductor die is bonded to the top surface of the first semiconductor die;
a passivation layer formed on the top surface of the second semiconductor die, on at least one of the plurality of side surfaces of the second semiconductor die, and on a portion of the top surface of the first semiconductor die that is not covered by the second semiconductor die, where the passivation layer is thinner than the second semiconductor die; and
first and second redistribution layers electrically connecting an electrical conductor at the top surface of the first semiconductor die and an electrical contact on the top surface of the second semiconductor die.

12. The semiconductor device of claim 11, wherein the second redistribution layer extends horizontally over the top surfaces of the first and second semiconductor die, and the second redistribution layer extends vertically along one of the plurality of side surfaces of the second semiconductor die.

13. The semiconductor device of claim 12, wherein the second redistribution layer follows a contour of the second semiconductor die and the first semiconductor die, the followed contour running from the electrical contact on the top surface of the second semiconductor die to the electrical conductor at the top surface of the first semiconductor die.

14. The semiconductor device of claim 12, wherein a portion of the second redistribution layer is plated along the one of the plurality of side surfaces of the second semiconductor die.

15. The semiconductor device of claim 11, wherein the electrical conductor at the top surface of the first semiconductor die is a conductive via that extends completely through the first semiconductor die.

16. The semiconductor device of claim 11, wherein the electrical conductor at the top surface of the first semiconductor die is covered by the second semiconductor die.

17. The semiconductor device of claim 16, wherein:
the top surface of the first semiconductor die is an uppermost and horizontal surface of the first semiconductor die; and
the first redistribution layer runs between the electrical conductor at the top surface of the first semiconductor die and a location over the top surface of the first semiconductor die that is not covered by the second semiconductor die.

18. The semiconductor device of claim 11, wherein the first and second semiconductor die are bonded together with two passivation layers, where the two passivation layers are formed of a same material.

19. A semiconductor device comprising:
a first semiconductor die comprising a top surface, a bottom surface, and a plurality of side surfaces connecting the top and bottom surfaces of the first semiconductor die;
a second semiconductor die comprising a top surface, a bottom surface, and a plurality of side surfaces connecting the top and bottom surfaces of the second semiconductor die, where the bottom surface of the second semiconductor die is bonded to the top surface of the first semiconductor die;
first and second redistribution layers electrically connecting an electrical conductor at the top surface of the first semiconductor die and an electrical contact on the top surface of the second semiconductor die;
a first passivation layer formed over the first semiconductor die, where a first portion of the first passivation layer is covered by the second semiconductor die, and a second portion of the first passivation layer is not covered by the second semiconductor die;
a second passivation layer formed over the first passivation layer and over the first redistribution layer, where a first portion of the second passivation layer is covered by the second semiconductor die, and a second portion of the second passivation layer is not covered by the second semiconductor die; and
a third passivation layer formed over the second semiconductor die and over the second portion of the first passivation layer and over the second portion of the second passivation layer.

20. The semiconductor device of claim 19, comprising a seed layer positioned between the second redistribution layer and the third passivation layer.

* * * * *